Figure 3:
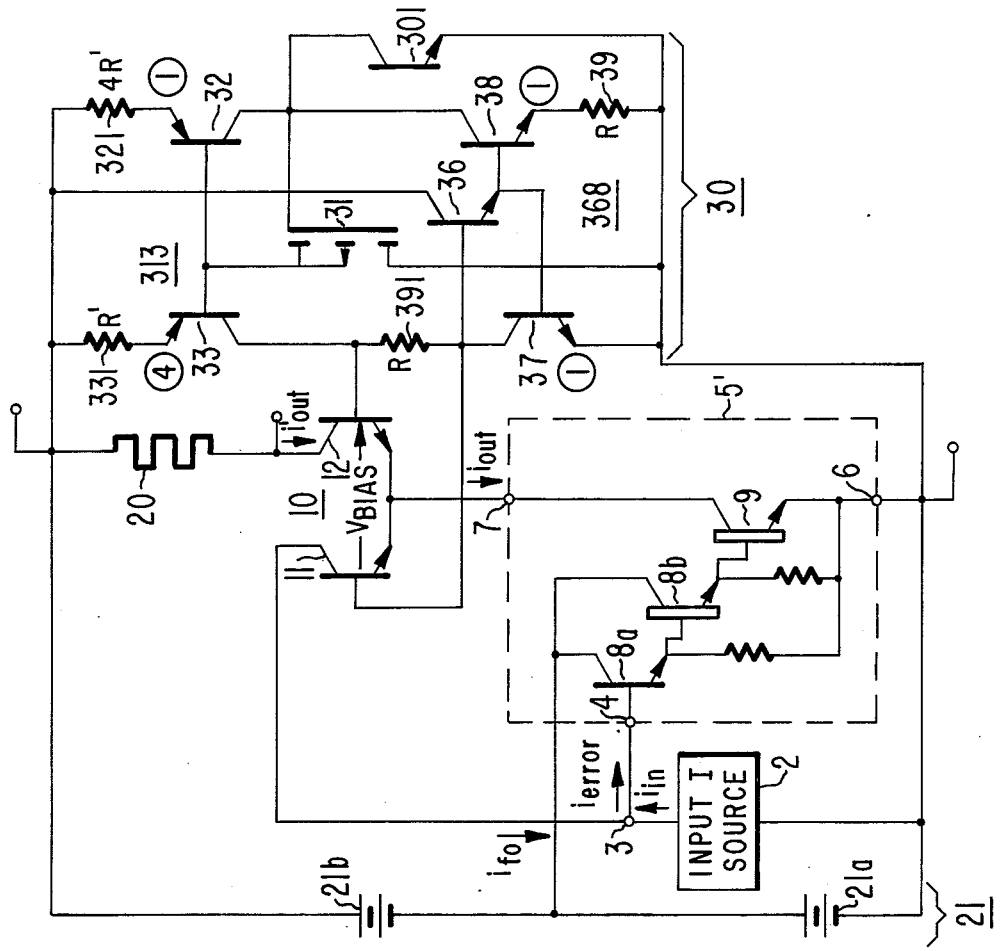

United States Patent [19]

Limberg

[11] 4,030,042
[45] June 14, 1977

[54] FEEDBACK AMPLIFIERS

[75] Inventor: Allen LeRoy Limberg, Lambertville, N.J.

[73] Assignee: RCA Corporation, New York, N.Y.

[22] Filed: Jan. 29, 1976

[21] Appl. No.: 653,496

[30] Foreign Application Priority Data

June 9, 1975 United Kingdom ............. 24714/75

[52] U.S. Cl. .................................. 330/18; 330/19; 330/22; 330/23; 330/25; 330/28; 330/30 D
[51] Int. Cl.² ........................................ H03F 3/42
[58] Field of Search ................... 330/18, 19, 22, 23, 330/25, 26, 28, 30 D, 38 M, 40; 323/2, 4

[56] References Cited

UNITED STATES PATENTS 3,921,091  11/1975  Van Kessel et al. ............. 330/32 D
3,922,614  11/1975  Van De Plassche ............. 330/18 X Primary Examiner—James B. Mullins
Attorney, Agent, or Firm—H. Christoffersen; S. Cohen; A. L. Limberg

[57] ABSTRACT

A three-terminal current amplifier with current-mode feedback to stabilize its current gain to be substantially independent of the common-emitter forward current gains of its component transistors. The feedback connection is made by means of a current splitter which includes a pair of emitter-connected transistors operated at substantially the same absolute temperature, T. These transistors have a potential substantially linearly proportional to T applied between their base electrodes. The current-amplifier output terminal is coupled to the interconnected emitter electrodes of the transistors and the collector electrode of the first transistor is coupled to the current-amplifier input terminal.

27 Claims, 9 Drawing Figures

FEEDBACK AMPLIFIERS

The present invention relates to feedback amplifiers of a type having current gains substantially independent of the common-emitter forward current gains ($h_{fe}$'s) of their component transistors.

Departure from the conventional feedback-amplifier comprising transconductive amplifying device, load resistor, and potential divider feedback network operating in the signal potential regime is advocated by the present inventor to avoid the problem encountered in integrated circuitry with obtaining accurate resistive potential dividers in an acceptably small die area. Rather, a feedback amplifier comprising a current amplifying device and a current divider network is espoused. The present invention contemplates such a feedback amplifier using a current divider network built around first and second emitter-connected transistors operated with smaller and larger densities of current flow through their respective base-emitter junctions. The ratio of these current densities is maintained in a fixed proportion so the collector current of the first transistor is a fixed fraction of the combined emitter currents of the transistors. Such current dividers may comprise first and second transistors with respectively smaller and larger base-emitter junction areas operated with similar base-emitter potentials. But operation with the base-emitter potential of the first transistor being maintained smaller than that of the second transistor by a decrement proportional to temperature is a preferred arrangement embodying the present invention since larger current division ratios can be obtained for a given die area.

Figure 1:
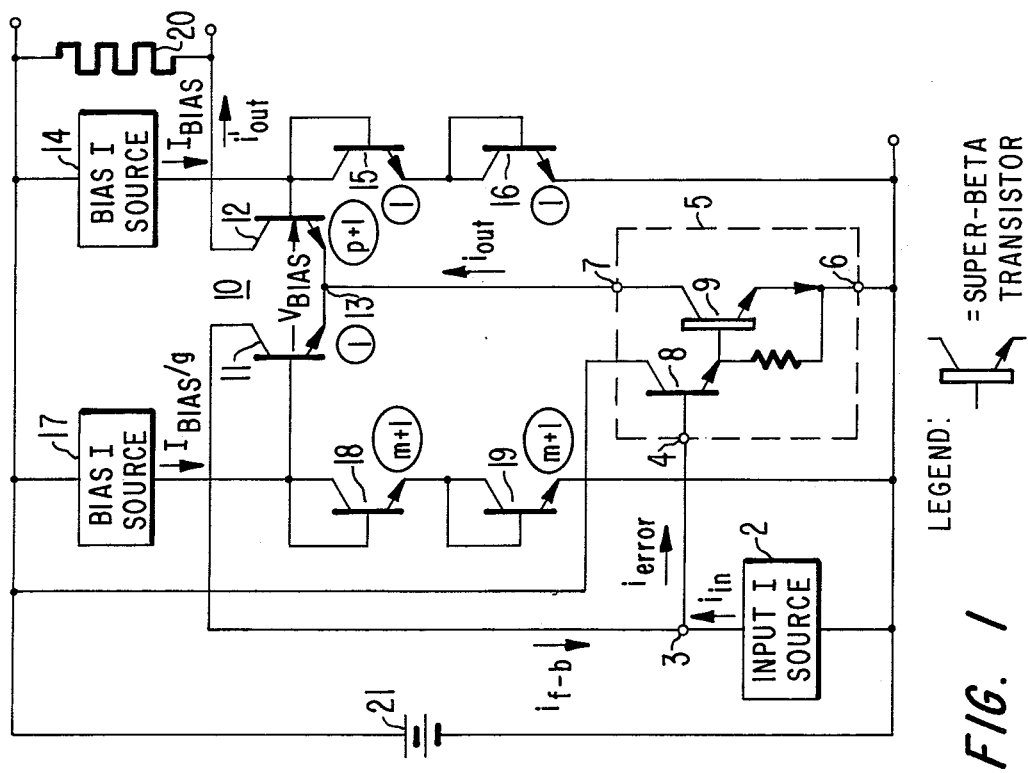
Figure 2:
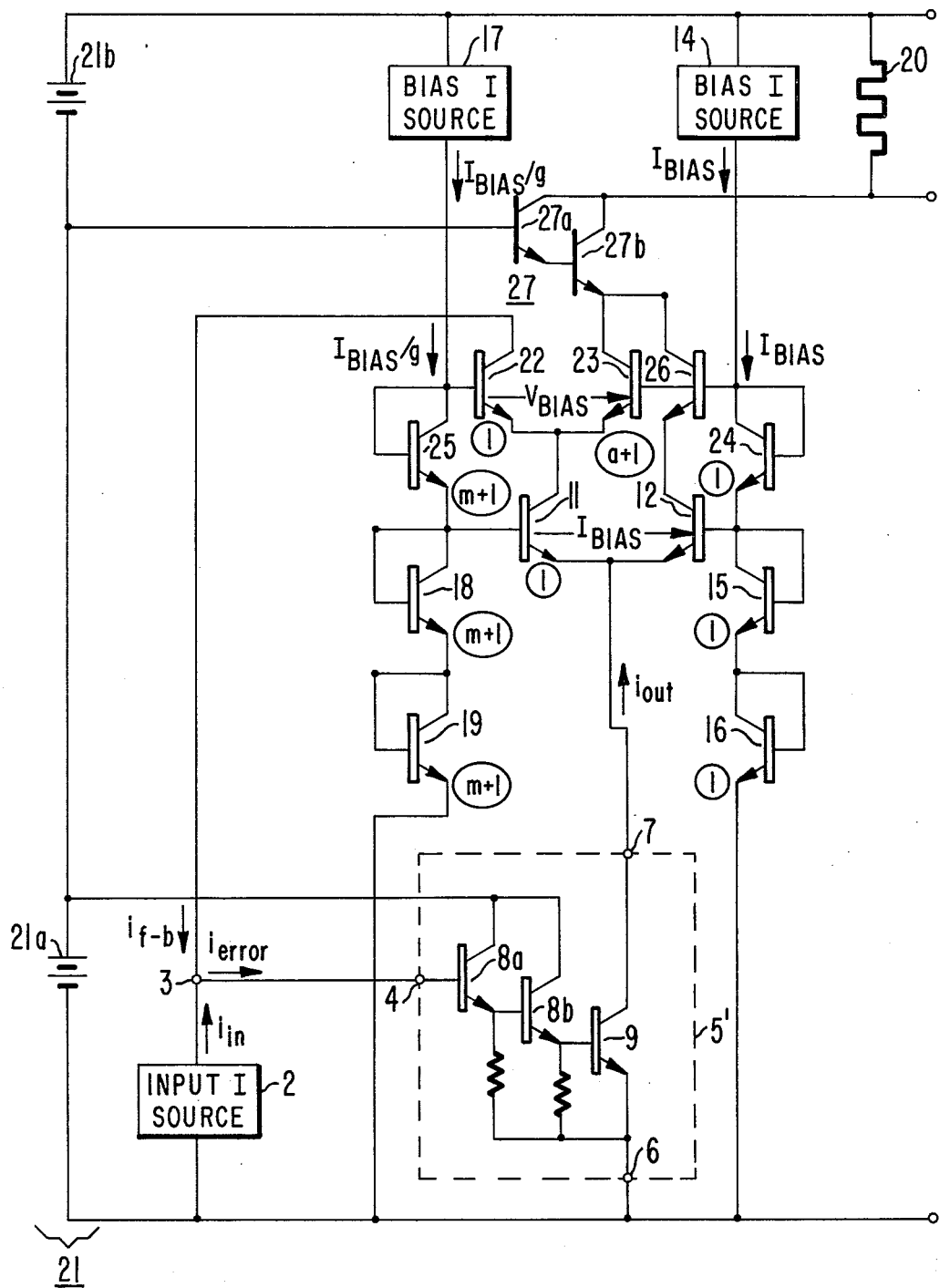
Figure 5:
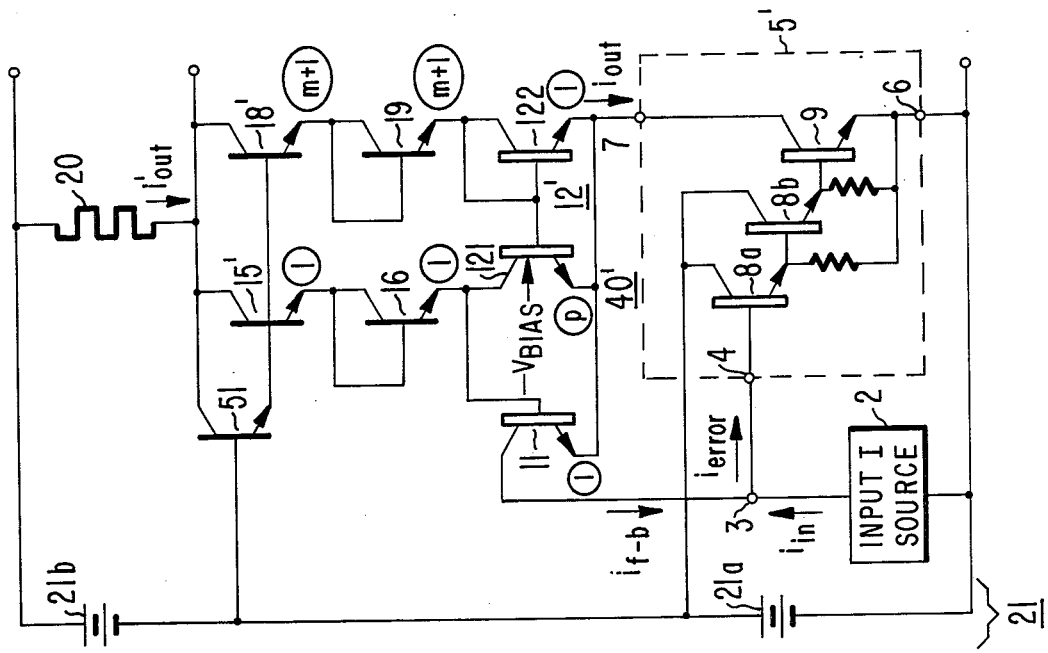
Figure 4:
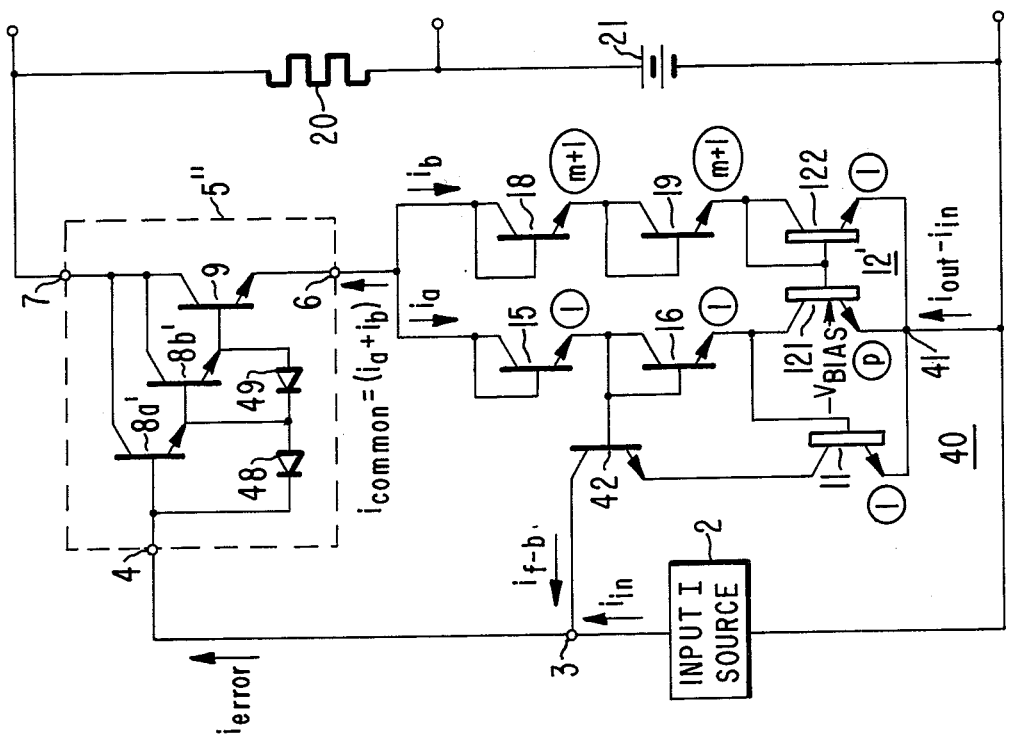
Figure 6:
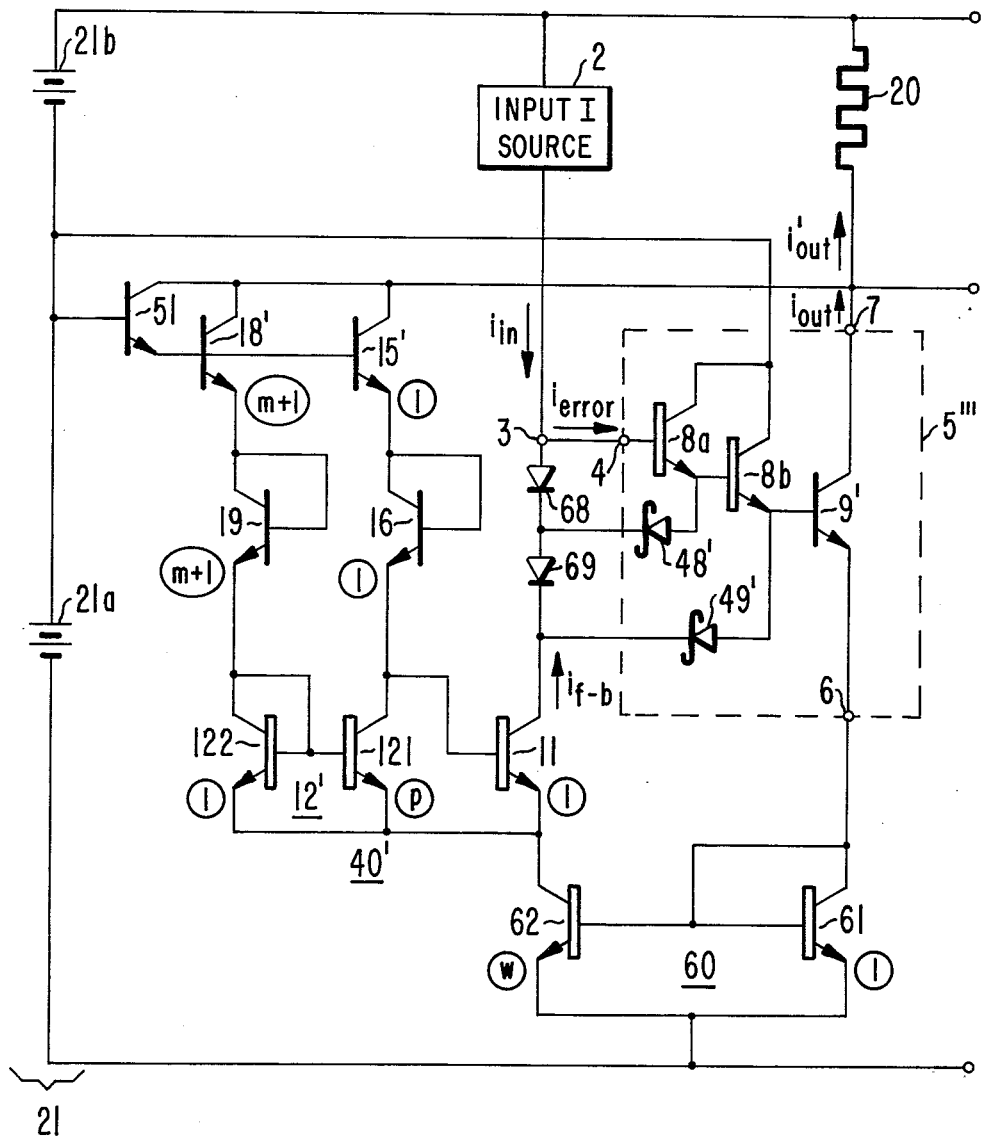
Figure 7:
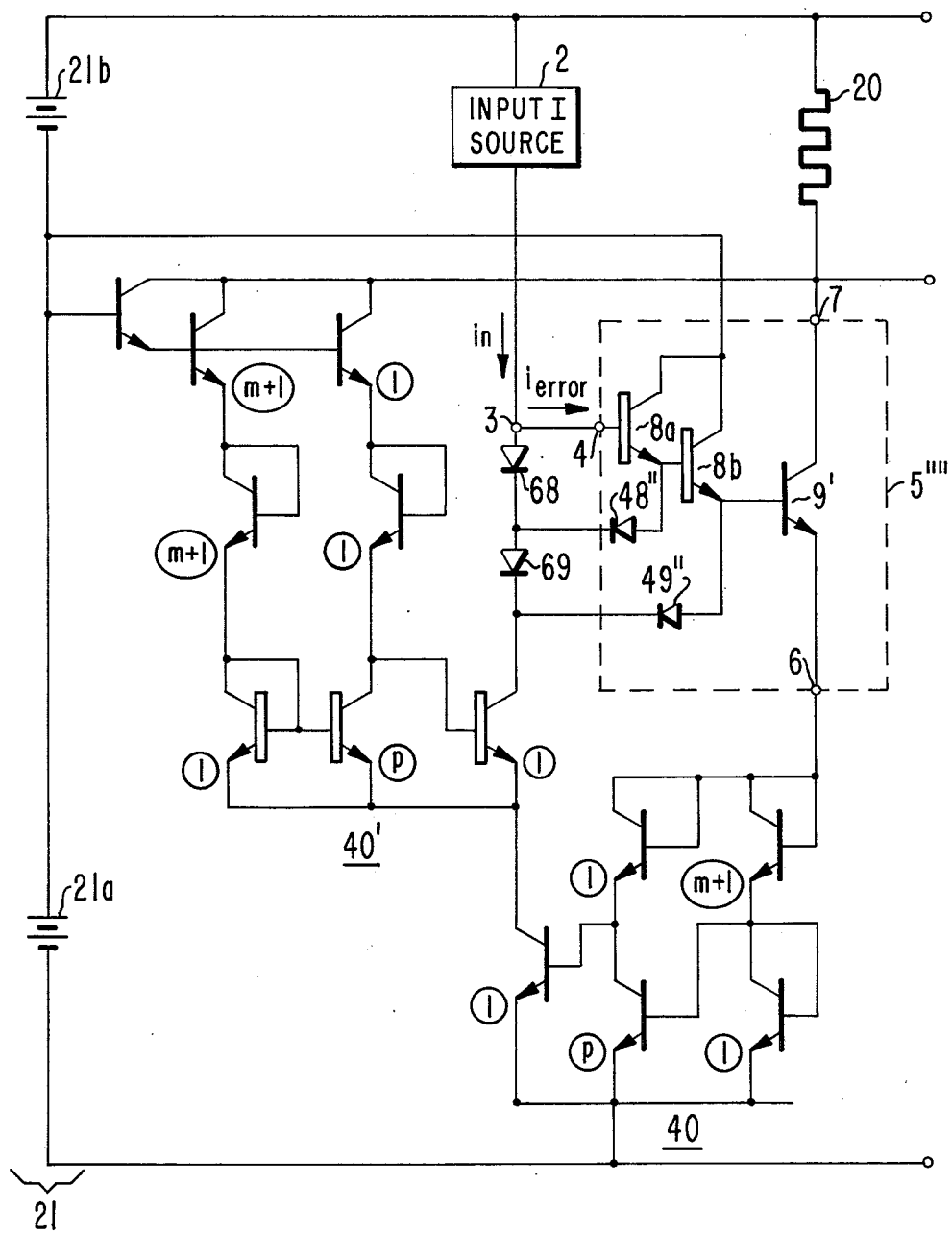
Figure 8:
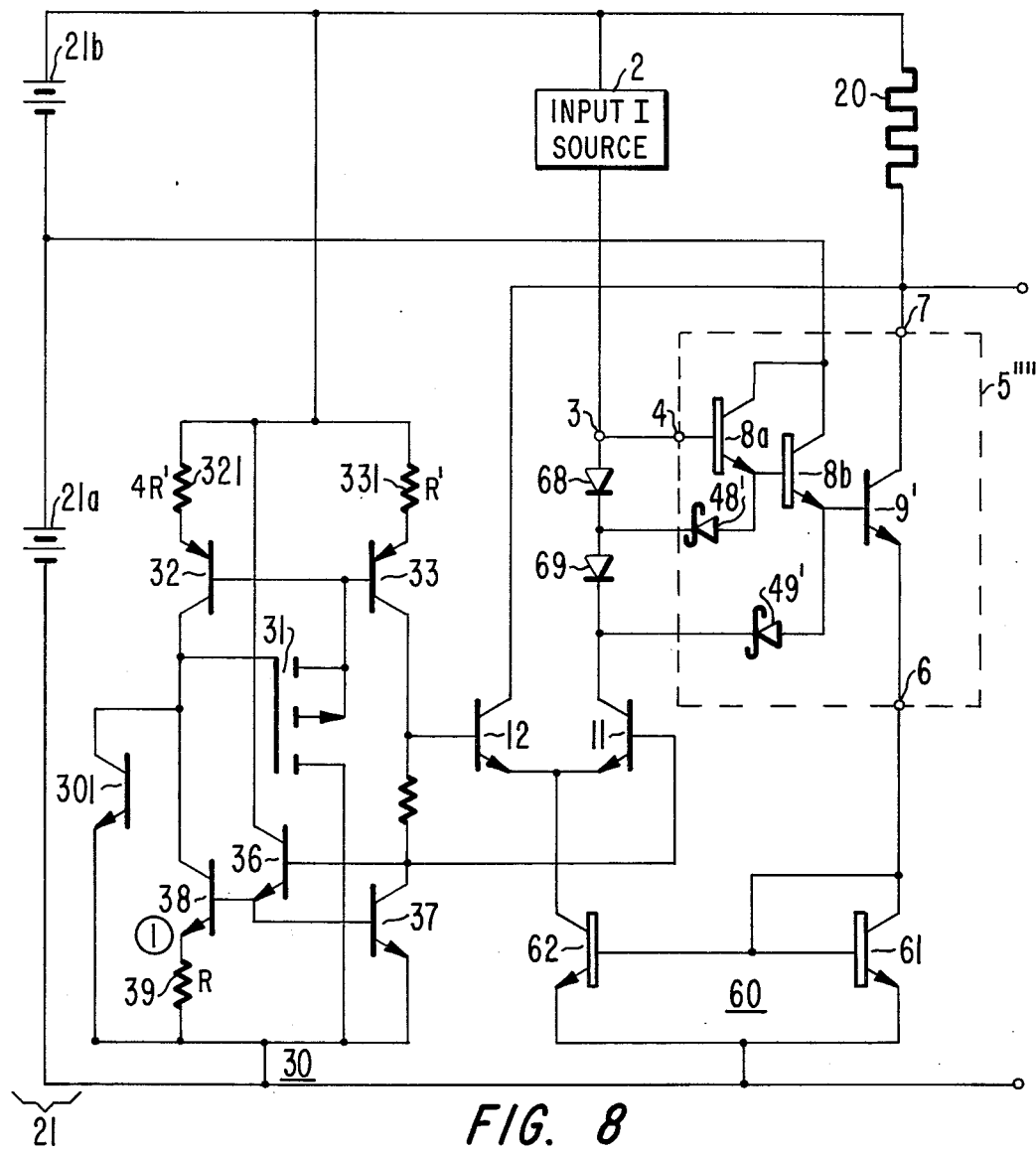

In the drawing, FIGS. 1–8 are schematic diagrams of feedback amplifiers according to various embodiments of the invention wherein:

In FIG. 1 $V_{BIAS}$ is developed as the difference between the offset potentials across first and second serial connections of self-biased transistors;

In FIG. 2 a feedback current is obtained from the output current of the amplifier by iterative current-splitting means;

In FIG. 3 $V_{BIAS}$ is developed across a resistance between the base electrodes of the current splitting transistors using a current-regulating positive feedback loop;

In FIG. 4 the current-splitting transistors split both the output and input currents of the current amplifier into first and second portions applied respectively to the summing point at the input terminal of the current amplifier and to the common terminal of the current amplifier;

In FIG. 5 $V_{BIAS}$ is developed responsive to the output current of the current amplifier;

In FIG. 6 a current splitting network is used similar to that shown in FIG. 5, but differently placed as implemented by a current mirror amplifier used as an auxiliary current-splitter;

In FIG. 7 the feedback amplifier is similar to that shown in FIG. 6, except the current mirror amplifier is replaced by a current splitting network similar to that shown in FIG. 4;

In FIG. 8 the feedback amplifier is similar to the feedback amplifier shown in FIG. 6, except that the current splitting network similar to that of FIG. 5 is replaced by a current splitting network similar to that of FIG. 3.

Figure 9:
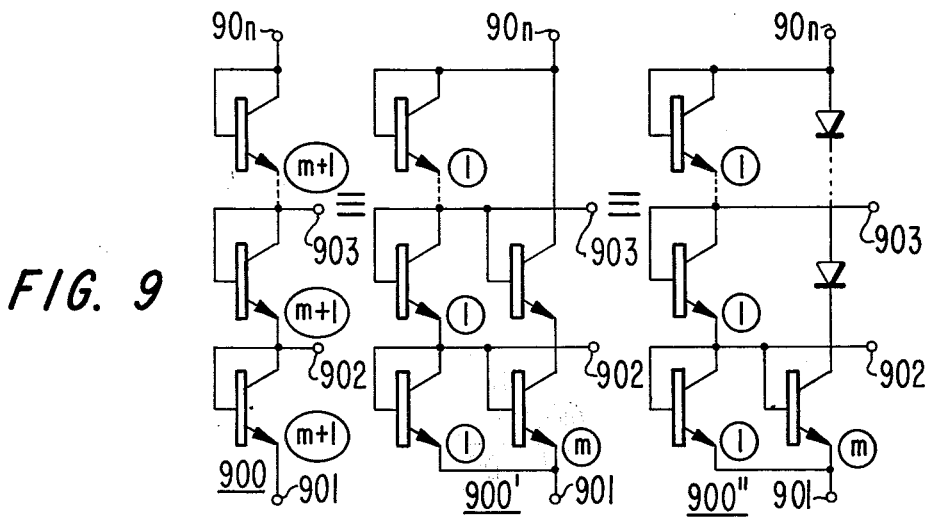

FIG. 9 is a schematic diagram of electrically equivalent circuits as may be used in alternative configurations of the feedback amplifiers shown in FIGS. 1, 2, 4, 5, 6 and 7.

In the FIG. 1 feedback amplifier, input current source 2 supplies an input current to a summing point 3 to which is connected the input terminal 4 of a current amplifier 5. Current amplifier 5 has a common terminal 6 and an output terminal 7. Current amplifier 5 exhibits a current gain of −G between its input and output terminals and a current gain of G+1 between its input and common terminals, G being a large positive number. Current amplifier 5 comprises transistor 8 connected in common-collector amplifier configuration followed in cascade by transistor 9 in common-emitter configuration.

Throughout the drawings, a transistor symbol such as used for transistor 9 indicates the use of a super-beta or punch-through transistor as indicated by the legend in FIG. 1. These super-beta transistors are characterized by a thin base region resulting in high $f_{fe}$, but low emitter-to-collector breakdown voltage $V_{CE\ MAX}$. A typical super-beta transistor has an $h_{fe}$ within a range between 1000 and 5000 and a $V_{CE\ MAX}$ of about 6 volts. A conventional vertical-structure integrated circuit transistor, such as 8, typically has an $h_{fe}$ within a range of between 40 and 200 and a $V_{CE\ MAX}$ of at least 25 volts. So, the current gain of current amplifier 5, which is substantially the product of the $h_{fe}$'s of transistors 8 and 9, can be expected to range from perhaps 40,000 to 1,000,000 (+92 to +120 dB).

Responsive to an error current $i_{error}$ applied to its input terminal 4, current amplifier 5 supplies an output current $i_{out}$ larger than $i_{error}$ by its +92 to +120 dB current gain to a current splitter 10. Current splitter 10 includes first transistor 11 and second transistor 12, which are thermally coupled to each other to operate at the same absolute temperature, T. The emitter electrodes of these transistors are connected to an interconnection 13 to which the current amplifier output terminal 7 is coupled. A potential $V_{BIAS}$ proportional to T, developed in a manner described in U.S. Pat. No. 3,867,685, is applied between the base electrodes of transistors 11 and 12 to cause transistor 12 to conduct more heavily than transistor 11. This splits $i_{out}$ into $i_{out}/(\gamma+1)$ and $\gamma i_{out}/(\gamma+1)$, which are well-defined fractions of $i_{out}$. The $i_{out}/\gamma+1$ fraction is coupled back through the emitter-to-collector path of transistor 11 to summing point 3 as feedback current $i_{f-b}$, where it counteracts $i_{in}$ to develop $i_{error}$. The $\gamma i_{out}/(\gamma+1)$ fraction (which in most designs according to the present invention is the preponderance of $i_{out}$) flows through the emitter-to-collector path of transistor 12, through load 20, and through potential source 21 to the current amplifier common terminal 6.

The nature of $V_{BIAS}$ in the FIG. 1 circuit can be analyzed more exactly, proceeding from the following well-known equation describing transistor action.

$$V_{BE} = (kT/q) \ln (I_E/AJ_s) \quad (1)$$

where:

$V_{BE}$ is the base-emitter offset potential of the transistor;
k is Boltzmann's constant,
q is the charge on an electron,
T is absolute temperature,
$I_E$ is the emitter current of the transistor, A is the effective area of the transistor base-emitter junction; and $J_S$ is the saturation emitter current density.

A numerical subscript after any of these quantities identifies the quantity as being associated with the transistor bearing that reference numeral; $J_S$ is assumed to be the same for all transistors constructed by the same process steps.

In FIG. 1, the effective area of the base-emitter junction of each of transistors 15 and 16 is, as shown by the encircled numbers near their emitter electrodes, unity on some arbitrary scale. The effective area of the base-emitter junction of each of transistors 18 and 19 is, as shown by the same convention of encircled numbers near the emitter electrode used elsewhere in the drawing, $(m+1)$ times unity on the same arbitrary scale, $m$ normally being a positive number a few times unity.

Bias current source 14 forces a current $I_{BIAS}$ to flow through serially-connected self-biased transistors 15 and 16 to develop a potential offset $V_{B12}$ between terminal 6 and the base electrode of transistor 12.

$$V_{B12} = V_{BE15} + V_{BE16}$$
$$= (kT/q) \ln (I_{BIAS}/J_S) + (kT/q) \ln (I_{BIAS}/J_S)$$
$$= 2 (kT/q) \ln (I_{BIAS}/J_S) \quad (2)$$

Bias current source 17 forces a current $I_{BIAS}/g$ to flow through serially-connected, self-biased transistors 18 and 19 to develop a potential offset $V_{B11}$ between terminal 6 and the base electrode of transistor 11.

$$V_{B11} = V_{BE18} + V_{BE19}$$
$$= (kT/q) \ln [I_{BIAS}/g (m+1) J_S] + (kT/q) \ln [I_{BIAS}/g (m+1) J_S]$$
$$= 2(kT/q) \ln [I_{BIAS}/g (m+1) J_S] \quad (3)$$
$$V_{BIAS} = V_{B12} - V_{B11}$$
$$= 2(kT/q) \ln (I_{BIAS}/J_S) - 2(kT/q) \ln [I_{BIAS}/g (m+1) J_S]$$
$$= 2(kT/q) \ln [g(m+1)] \quad (4)$$

The derivation above can be extended to the case where $n$, the number of self-biased transistors in each series combination, is not just two but any other number $n$ to obtain a more general expression of $V_{BIAS}$. In general, $$V_{BIAS} = n (kT/q) \ln [g(m+1)] \quad (5)$$

A $V_{BIAS}$ of this type can be provided with other types of circuitry as well, as will be shown with regard to FIG. 3. Indeed, in the FIG. 3 circuitry, $n$ can assume non-integral values.

When $n$ is greater than two, current amplifier 5 must be modified with at least $(n-2)$ further common-collector collector amplifier transistors preceding common emitter amplifier transistor 9, or alternative measures must be taken to assure that the collector electrode of transistor 11 is biased properly with respect to its other electrodes to operate it in the normal mode of transistor operation.

$V_{BIAS}$ also expresses the difference in the base-emitter potential offsets $V_{BE12}$ and $V_{BE11}$ of transistors 11 and 12.

$$V_{BE11} = (kT/q) \ln (i_{f-b}/J_S) \quad (6)$$
$$V_{BE12} = (kT/q) \ln [(i_{out}-i_{f-b})/(p+1)J_S] \quad (7)$$
$$V_{BIAS} = V_{BE12} - V_{BE11}$$
$$= (kT/q) \ln [(i_{out}- i_{f-b})/(p+1)J_S] - (kT/q) \ln (i_{f-b}/J_S)$$
$$= (kT/q) \ln [(i_{out}- i_{f-b})/(p+1)i_{f-b}] \quad (8)$$

By cross-solving equations 5 and 8, an expression of $i_{error}$ in terms of $i_{out}$ can be obtained.

$$(kT/q) \ln [(i_{out}-i_{f-b})/(p+1)i_{f-b}] = V_{BIAS} = n(kT/q) \ln [g(m+1)] \quad (9)$$
$$i_{f-b} = i_{out}/\{1 + (p+1) [g(m+1)]^n\} \quad (10)$$

In accordance with Kirchoff's Current Law, the following node equation can be written describing the flow of currents into and out of summing point 3.

$$i_{in} + i_{f-b} = i_{error} \quad (11)$$

Assuming the open-loop current gain of current amplifier 5 to be $-G$, the following equation can be written.

$$i_{out} = -G \, i_{error} \quad (12)$$

Substituting equations (10) and (12) into equation (11), an expression for $i_{out}/i_{in}$, the closed-loop gain of current amplifier 5, can be obtained.

$$\frac{i_{out}}{i_{in}} = \frac{G \{1 + (p+1) [g(m+1)]^n\}}{G + \{1 + (p+1) [g(m+1)]^n\}} \quad (13)$$

If G is enough larger than $1 + (p+1) [g(m+1)]^n$, equation (13) is closely approximated by equation (14) following.

$$(i_{out}/i_{in}) = -\{1+(p+1) [g(m+1)]^n\} \quad (14)$$

If G is larger by 20dB than $\{1+(p+1) [g(m+1)]^n\}$, this approximation is accurate to within 1%; if by 30dB, to within 0.1%.

The full value of $i_{out}$ does not flow to load 20. Rather, a current $i_{out}'$ smaller than $i_{out}$ by $i_{f-b}$ does, leading to equation 15 following.

$$i_{out}' = i_{out} - i_{f-b} \quad (15)$$

Substituting for $i_{f-b}$ its value as expressed in equation (10) into equation (15), equation (16) results.

$$i_{out}' = i_{out} (p+1) [g(m+1)]^n/\{1+(p+1) [g(m+1)]^n\} \quad (16)$$

Dividing through by $i_{in}$ and substituting from equation (14), the following overall current gain from input current source 2 to load 20 for relatively high values of G is obtained.

$$i_{out}'/i_{in} = -(p+1) [g(m+1)]^n \quad (17)$$

Fairly modest values of $p$, $g$, $m$ and $n$ result in reasonably high current gains. E.g., for $p=4$, $g=4$, $m=4$, $n=2$, the current gain $i_{out}'/i_{in} = 2000$ (that is, +66dB). This gain is about 26dB smaller than the smallest expected value of G, so equation (17) accurately describes the operation of this illustrative circuit. An important feature of this circuit (and of the other described below) is that the gain obtained is a well-defined value which is substantially indepedent of the $h_{fe}$'s of component transistors and of the operating temperature.

FIG. 2 shows a feedback amplifier wherein the feedback connection uses iterative current splitting. The current $i_{out}$ is split first by transistors 11 and 12, and the smaller resulting portion is then subsequently split by transistors 22 and 23. In the first current splitting $n = 2$ as in FIG. 1; in the second current splitting $n = 3$. The same self-biased transistors 15, 16, 18, 19 used to develop $V_{BIAS}$ between the base electrodes of current-splitting transistors 11 and 12 are used together with further self-biased transistors 24 and 25 to develop the $V_{BIAS}'$ between the base electrodes of current splitting transistors 22 and 23. Iterative current splitting using shared networks to develop offset potentials between the base electrodes of the current splitting transistors is very efficient at achieving large current attenuation at a relatively small cost in die area.

Battery 21 comprises the serial connection of batteries 21a and 21b, battery 21a supplying the lower emitter-to-collector potentials necessary for super-beta transistors 8a and 8b in current amplifier 5'. As in the FIG. 1 amplifier, transistor 9 receives a regulated emitter-to-collector potential from the current splitting apparatus which potential is well within its $V_{CE\ MAX}$ limitation.

Note the use of super-beta transistors in the current-splitting apparatus to avoid scaling errors otherwise caused by the base currents of the transistors not being sufficiently negligible as compared to collector currents. The transconductances of super-beta transistors are more affected by their emitter-to-collector potentials than is the case with conventional transistors. Accordingly, transistor 26 is connected in cascode with transistor 12 to regulate the emitter-to-collector potential of transistor 12 to more closely equal that of transistor 11, so the collector currents of transistors 11 and 12 are more accurately proportioned.

A composite transistor 27 comprises a Darlington configuration of transistors 27a and 27b. The composite transistor 27 is in effect a common base amplifier with a current gain very nearly equal to one, for coupling the combined collector currents of transistors 23 and 26 to the load 20. The potential applied to the base electrode of transistor 27a is chosen so that transistors 23 and 26 have a suitably small emitter-to-collector voltage, and this potential may be provided by a multiple-$V_{BE}$ supply providing a +5$V_{BE}$ potential, for example, rather than by a battery 21a as shown.

FIG. 3 shows a feedback amplifier of the same sort as that shown in FIG. 1; the circuitry 30 for developing $V_{BIAS}$ is different, however, being essentially a current regulator connected across the battery 21, which comprises batteries 21a and 21b in series. Elements 31, 32, 33, 321 and 331 are connected as a current amplifier 313 having an input connection to which the gate electrode of MOSFET 31 and collector electrode of transistor 32 are connected, having a common connection at the interconnection of resistors 321 and 331, having an output connection at the collector electrode of transistor 33, and exhibiting a current gain of −4 between its input and output connections. Elements 36, 37, 38 and 39 are connected as a current amplifier 368 having an input connection to which the base electrode of transistor 36 and collector electrode of transistor 37 are connected, having a common connection to which the emitter electrodes of transistors 37 and 38 are connected respectively by direct connection and by connection via resistor 39, and having an output connection at the collector electrode of transistor 38. The output connection of current amplifier 368 is connected to the input connection of current amplifier 313, and the output connection of current amplifier 313 is connected via resistor 391 to the input connection of current amplifier 368, thereby forming a positive feedback loop for current. Conduction in this loop is initiated, for example, by the leakage current through an open-base transistor 301.

At relatively low current levels the current gain of current amplifier 368 is closed to −1, so the current gain in the positive feedback loop (which gain is the product of the current gains of current amplifiers 313 and 368) exceeds unity. Consequently, the levels of current in the loop increase monotonically. At higher current levels the emitter resistance of transistor 38 decreases sufficiently that the emitter-degeneration resistance 39, which is typically about a hundred ohms in value, begins to reduce the current gain of current amplifier 368. The growth of currents in the positive feedback loop halts when the closed loop gain is reduced to unity, which occurs when the current gain of current amplifier 368 is reduced to −¼. That is, stable loop conditions are achieved when the current through the collector-to-emitter paths of transistors 33 and 37 (and resistance 391) is four times the current through the collector-to-emitter paths of transistors 32 and 38 (and resistance 39).

For these current conditions to obtain it is necessary, in order that equation (1) be satisfied, that the base-emitter potential of transistor 37 exceed that of transistor 38 by about 36 millivolts, the excess appearing as the potential drop across resistor 39. Resistance 391 connected between the base electrodes of transistors 11 and 12 is substantially identical in value to resistance 39. Inasmuch as the current level through resistor 391 is four times that through resistance 39, then by Ohm's Law the potential drop across resistance 391 is four times that across resistance 39. $V_{BIAS}$ therefore is about 144 millivolts and is proportional to the difference between the base-emitter offset potentials of a pair of NPN transistors 37 and 38. This results in the transistor 12 having to have a collector current, $i'_{out}$, 256 times as large as the collector current of transistor 11, $i_{f-b}$, which when the current gain −G of current amplifier 5' is high is substantially equal in amplitude to $i_{in}$ in order than $i_{error}$ be appropriately comparatively small. The current gain of the FIG. 3 amplifier from input current source 2 to the load 20 is therefore substantially equal to 256 (+48dB) and is substantially independent of $h_{fe}$ variations of its transistors.

A wide variety of circuits for producing $V_{BIAS}$ of the same general type as circuit 30 is available, each of them characterized by comprising a positive feedback loop stabilized by the development of a difference in the base-emitter potentials of component transistors as current levels in the loop increase, and each characterized by $V_{BIAS}$ being proportioned to this difference in potentials. These circuits are attractive in that the relatively large values of $V_{BIAS}$ required for current amplifiers embodying the present invention and providing substantial current gains (say, in tens of decibels) are easily developed without need for further circuit components. Simply doubling resistance 391 in the FIG. 3 configuration, for example, would permit a reasonably well-defined current gain in excess of +90dB.

FIG. 4 shows a feedback amplifier wherein the current amplifier 5" comprises a Darlington cascade of conventional transistors 8a', 8b', 9 arranged to respond to a current $i_{error}$ supplied from a summing point 3 to its input terminal 4 to cause an amplified response $i_{out}$ to flow from its output terminal 7; through load 20 battery 21, and portions of a current splitting network 40; and back as a portion of $i_{common}$ to its common terminal 6. In current splitting network 40, as described in U.S. Pat. No. 3,868,581, the potential $V_{BIAS}$ is maintained between the base electrode of transistor 11 and the joined base electrodes of transistors 121 and 122.

Transistors 121 and 122 are connected in current mirror amplifier configuration 12'. They operate as a composite transistor having a "base" electrode at the joined base electrodes of transistors 121 and 122 and collector electrode of transistor 122, having an "emitter" electrode at the interconnection 41 of the emitter electrodes of transistors 121 and 122, having a "collector" electrode at the collector electrode of transistor 121, and exhibiting a current gain between its "base" and "collector" electrodes of $p$ by virtue of the areas of the base-emitter junctions of transistors 121 and 122 being in $p:1$ ratio, respectively.

Transistor 42 has its base electrode biased at a $+2V_{BE}$ offset from interconnection 41 and is in cascode connection with transistor 11 to maintain the collector electrode of transistor 11 at $+1V_{BE}$ offset from interconnection 41. This makes the emitter-to-collector potentials of transistors 11, 121 and 122 all substantially equal to $+1V_{BE}$, which is necessary for accurately matching the transconductance of super-beta type transistors. Transistors 11, 42, 121 and 122 preferably are super-beta types so their base currents are negligible. Then, the emitter and collector currents of transistors 11 and 41 are substantially equal with negligible base current error. Also, the emitter currents of transistors 15, 16 and 121 are made substantially equal to the same value $i_a$; and the emitter currents of transistors 18, 19 and 122 are made substantially equal to the same value $i_b$. Currents $-i_a$ and $-i_b$ are components of the current $i_{common}$ presumed to flow into terminal 6 of current amplifier 5''. Transistors 15, 16, 17 and 18 may be either super-beta or conventional types of transistors.

The current gain of the FIG. 4 feedback amplifier depends on the ratio of the current $i_{f-b}$ to the current $(i_{out} - i_{in})$ as determined by current splitting network 40. The value of this ratio can be calculated, proceeding from the following observation in accordance with Kirchoff's Law of Potentials.

$$V_{BE15} + V_{BE16} + V_{BE11} = V_{BE18} + V_{BE19} + V_{BE122} \quad (18)$$

Equation (1) may be substituted into equation (18) to obtain equation (19) following.

$$(kT/q) \ln (-i_{f-b}/J_S) + 2kT/q \ln (i_a/J_S) = 2(kT/q) \ln [i_b/(m+1)J_S] + (kT/q) \ln (i_b/J_S) \quad (19)$$

By virtue of the current mirror amplifier configuration 12' having a current gain of $p$, equation (20) obtains which leads to equations (21) and (22).

$$i_a = pi_b \quad (20)$$
$$i_a = p(i_a + i_b)/(p+1) \quad (21)$$
$$i_b = (i_a + i_b)/(p+1) \quad (22)$$

Substituting equations (21) and (22) into equation (19) an expression for $i_{f-b}$ in terms of $(i_a + i_b)$ is obtained.

$$i_{f-b} = -(i_a+i_b)/\{(p+1) [p(m+1)]^2\} \quad (23)$$

More generally, where the number of self-biased transistors connected in series with each of the collector-to-emitter paths of transistors 121 and 122 is $n$ in number, $n$ being able to assume any positive value as well as two, equation (24) derived similarly as above applies.

$$i_{f-b} = -(i_a+i_b)/\{(p+1) [p(m+1)]^n\} \quad (24)$$

So, by Kirchoff's Law of Currents, current splitting network 40 attenuates the current $(i_{out}-i_{in})$ applied to interconnection 41 by a factor of $\gamma = 1+(p+1)[m(m+1)]^n$, giving rise to equation (25).

$$i_{f-b} = -(i_{out}-i_{in})/\{1+(p+1)[p(m+1)]^n\} = -(i_{out}-i_{in})/\gamma \quad (25)$$

Now, suppose the open-loop current gain of current amplifier 5'' to be $-G$.

$$i_{out} = -G\, i_{error} \quad (26)$$

Kirchoff's Law of Currents applied with regard to summing point 3 gives rise to equation (27).

$$i_{error} = i_{in} + i_{f-b} \quad (27)$$

Combining equations (25), (26) and (27), the following expression for closed-loop current gain $(i_{out}/i_{in})$ for the feedback amplifier of FIG. 4 is obtained.

$$(i_{out}/i_{in}) = -G(\gamma-1)/(G+\gamma) \quad (28)$$

Where $G$ is sufficiently larger than $\gamma$, the following approximation will describe the closed-loop current gain of the FIG. 4 feedback amplifier.

$$i_{out}/i_{in} = -(\gamma-1) = -(p+1)[p(m+1)]^n \quad (29)$$

This closed-loop current gain is substantially independent of the $h_{fe}$'s of component transistors, and large values of well-defined current gain are obtainable with modest values of $p$, $m$ and $n$.

Diodes 48 and 49 in current amplifier 5'' are for discharging stored base charge from transistors 8a' and 9' when $i_{in}$ is reduced in value. This stored base charge tends to make transistors 8b' and 9' continue to conduct after $i_{in}$ is reduced. Their continuing currents make $-i_{f-b}$ larger than $i_{in}$, reversing the direction of $i_{error}$ flow. This flow biases diodes 48 and 49 into conduction and draws out the stored base charge from transistors 8b' and 9', reducing their conduction appropriately. This pull-down of the base electrodes of transistors 8b' and 9' is fast and appreciably speeds up the response of the feedback amplifier to rapid decreases of $i_{in}$. An advantage of putting the gain-determining current-splitting network in the common connection of the current amplifier is the availability of this type of pull-down.

A disadvantage of this placement of the current splitting network is that the common terminal 6 and consequently the input terminal 4 of the current amplifier 5'' are separated further in potential from the supply potential to which common terminal 6 is returned. Also, the current splitting network does not regulate the collector potential of transistor 9, so if a super-beta type be used the designer must provide an arrangement (e.g., cascoding) for keeping its emitter-to-collector potential appropriately low.

FIG. 5 shows a feedback amplifier using a current splitting network 40' similar to 40, but connected to split solely the output current $i_{out}$ of current amplifier 5'. Transistor 51 is in Darlington configuration with transistors 15' and 18' so that most of their base currents is coupled by its common-base amplifier action to flow together with their combined collector currents through load 20. The potential applied to the base electrode of transistor 51 is chosen sufficiently positive that, even as diminished by the offset potentials across the base-emitter junction of the transistors in current-splitting network 40, it furnishes transistor 9 sufficient emitter-to-collector potential to operate in the normal mode of transistor operation. Equations 11, 12, 24 and 15 can be combined to show the closed-loop current gain ($i_{out}'/i_{in}$) of the FIG. 5 amplifier to be substantially equal to $-(p+1) [p(m+1)]^n$.

FIG. 6 shows a feedback network using current splitting network 40' in cascade after a current mirror amplifier 60 in a feedback connection between the common terminal 6 and input terminal 4 of current amplifier 5'''. Current amplifier 5''' is interesting in that the common-collector amplifier transistors 8a and 8b, the emitter-to-collector potentials of which can be easily constrained, are of super-beta type while the ensuing common-emitter amplifier transistor 9, likely to be exposed to large emitter-to-collector potentials, is of conventional type. Current amplifier 60 can advantageously use super-beta type transistors to reduce current gain error caused by the base currents of both its component transistors 61 and 62 flowing in its input circuit. By administering the collector currents of transistors 51, 18', 15' to the load 20, the current gain of current amplifier 5''' is augmented by the current gain w of current mirror amplifier 60, although alternatively these collector electrodes might be connected directly to a supply of operating potential. The closed-loop current gain of the FIG. 6 feedback connected as shown is substantially equal to $1 + p [p (m+1)]^n$.

Schottky diodes 48' and 49' are used for removing stored base charge from transistors 8b and 9'. Diodes 68 and 69 adjust their cathode potentials to cause the Schottky diodes 48' and 49' to be more rapidly forward biased responsive to reduction of $i_{in}$.

FIG. 7 shows a feedback amplifier in which a cascade of current splitting networks 40 and 40' are connected in a feedback connection between common terminal 6 and input terminal 4 of a current amplifier 5''''. Cascading of the current splitting networks 40 and 40' multiplies their attenuating properties insofar as developing a small $i_{f-b}$ is concerned. Larger attenuation for a given total of base-emitter-junction areas of component transistors in the current splitting network(s) can be obtained this way. The larger offset between terminal 6 and the negative terminal of battery 21a facilitates pull-down diodes 48'' and 49'' being self-biased transistors or junction diodes rather than Schottky diodes.

FIG. 8 shows a feedback amplifier similar to that shown in FIG. 6, but using the same sort of current splitting network as used in the FIG. 3 feedback amplifier.

The feedback amplifiers of FIGS. 1 through 8 will, in the light of the foregoing specification, suggest many alternative configurations embodying the present invention to the mind of the skilled circuit designer, and the ready availability of alternative configurations should be borne in mind when evaluating the scope of the following claims. The chains of self-biased transistors in current splitting networks 40 and 40' can be used for biasing emitter-coupled current-splitting transistor pairs to be cascaded after transistor 11, for example. The chain 900 of self-biased transistors with base-emitter junctions having areas of $m+1$ in the feedback amplifiers of FIGS. 1, 2, 4, 5, 6 and 7 can be replaced, per FIG. 9, by electrically equivalent networks 900', 900'', as viewed from terminals 901, 902, 903, ... 90n. With regard to the feedback amplifiers of FIGS. 3 and 8 the current sensing resistor 391 alternatively can be connected to respond to the combined emitter currents of transistors 37 and 38 or of transistors 32 and 33, but this will require additional components to properly offset the base potentials of transistors 11 and 12 from the output terminal 7 of current amplifier 5' (or 5''''). It should be understood that the The venin series combination of battery 21 and load 20 can be replaced by its Norton equivalent circuit, the parallel combination of load 20 and a constant current source.

What is claimed is:

1. A feedback amplifier comprising, in combination:
    a current amplifier having a signal input terminal, which is also the signal input terminal for said feedback amplifier, and an output terminal;
    a current divider which includes a common terminal and first and second branch terminals, which second branch terminal is also the output terminal of said feedback amplifier, said current divider including first and second transistors, each having base and emitter and collector electrodes and being operated at substantially the same absolute temperature T, the emitter electrodes of said first and said second transistors being connected to said common terminal of said current divider and the collector electrodes of said first and said second transistors being connected respectively to said first branch terminal and to said second branch terminal, said current divider including means responsive to the temperature of said first and said second transistors for supplying a potential in fixed proportion to T, and means for applying said potential in fixed proportion to T between the base electrodes of said first and said second transistors in the poling that tends to reduce the flow of current through said first transistor as compared to the flow of current through said second transistor, the common terminal of said current divider being connected to the output terminal of said current amplifier; and
    feedback circuit means connected between the first branch terminal of said current divider and the signal input terminal of said current amplifier for supplying a feedback current to said amplifier.

2. A feedback amplifier comprising, in combination:
    means for supplying an input current to a summing point;
    a current amplifier having an input terminal connected to said summing point to receive an error current therefrom, having an output terminal through which an output current responsive to said error current flows, and having a common terminal through which said error and said output currents flow;
    first and second transistors which are of similar conductivity type, which are arranged for operation at substantially the same absolute temperature T, and which each have base and emitter and collector electrodes; and
    means connecting said first and second transistors as a current splitter for splitting said output current into portions and coupling at least a fraction of one of the portions to said summing point as a feedback current, where it is summed with said input current to provide said error current, said means including:
    a first interconnection to which the emitter electrodes of said first and second transistors are connected;

means coupling the output terminal of said current amplifier to said first interconnection;

means for applying a potential between the base electrodes of said first and said second transistors which potential is in fixed proportion proportional to the temperature T and is of a poling to make the potential appearing between the base and emitter electrodes of said first transistor smaller than that appearing between the base and emitter electrodes of said second transistor; and means coupling the collector electrode of said first transistor to said summing point.

3. A feedback amplifier as set forth in claim 2 wherein said current amplifier includes:

third and fourth transistors of said similar conductivity type, each having base and emitter and collector electrodes, the base electrode of said third transistor being directly connected to said current amplifier input terminal, the emitter electrode of said fourth transistor being directly connected to said current amplifier common terminal, and the collector electrode of said fourth transistor being directly connected to said current amplifier output terminal;

means for applying a potential to the collector electrode of said third transistor to condition it for the normal mode of transistor operation; and means for direct coupling the emitter electrode of said third transistor to the base electrode of said fourth transistor.

4. A feedback amplifier as set forth in claim 2 wherein said means for applying a potential between the base electrodes of said first and said second transistors comprises:

means for supplying first and second bias currents in fixed proportion to each other;

a first plurality, $n$ in number, of self-biased transistors serially connected between said first transistor base electrode and said current amplifier common terminal and arranged for easily conducting a determinate portion of said first bias current; and a second plurality, $n$ in number, of self-biased transistors serially connected between said second transistor base electrode and said current amplifier common terminal and arranged for easily conducting said second bias current.

5. A feedback amplifier as set forth in claim 4 wherein said current amplifier includes a plurality, at least $n$ in number, of further transistors of said similar conductivity type, each having base and emitter electrodes with a base-emitter junction therebetween and each having a collector electrode; a serial connection of the base-emitter junctions of said further transistors with the base electrode of the first of these further transistors being connected to the input terminal of said current amplifier, the base electrode of each succeeding one of said further transistors connected to the emitter electrode of the preceding one of said further transistors, and the emitter electrode of the last of said further transistors connected to the common terminal of said current amplifier; and means for applying collector potentials to each of said further transistors including a connection of the collector electrode of at least said last of said further transistors in said serial connection to said first interconnection.

6. A feedback amplifier as set forth in claim 2 wherein said means coupling the collector electrode of said first transistor to said summing point is a conductive path for applying the entire collector current of said first transistor to said summing point as said feedback current.

7. A feedback amplifier as set forth in claim 2 wherein said means coupling the collector electrode of said first transistor to said summing point comprises:

third and fourth transistors which are of similar conductivity type to each other and to said first and said second transistors, which are arranged for operation at substantially the temperature T, and which have base and emitter and collector electrodes; and means connecting said third and said fourth transistors as a current splitter for splitting the collector current of said first transistor into portions and coupling at least a fraction of one of the portions to said summing point as said feedback current, said means including:

a second interconnection to which the emitter electrodes of said third and said fourth transistors and the collector electrode of said first transistor are connected;

means for applying a potential between the base electrodes of said third and said fourth transistors which is substantially linearly proportional to the temperature T and is of a poling to make the potential appearing between the base and emitter electrodes of said third transistor smaller than that appearing between the base and emitter electrodes of said fourth transistor; and means coupling the collector electrode of said third transistor to said summing point.

8. A feedback amplifier as set fourth in claim 2 wherein said means for applying a potential between the base electrodes of said first and said second transistors comprises:

second and third current amplifiers, each having an input terminal and a common terminal and an output terminal, at least one of which second and third current amplifiers exhibiting a current gain that decreases with increasing current levels therein, the product of their low-level current gains exceeding unity;

means for applying a potential between the common terminals of said second and said third current amplifiers;

means for conducting a first bias current connected between the output terminal of said second current amplifier and the input terminal of said third current amplifier;

means for conducting a second bias current connected between the output terminal of said third current amplifier and the input terminal of said second current amplifier; and a resistance connected between the base electrodes of said first and said second transistors and arranged to conduct at least one of said first and said second bias currents.

9. A feedback amplifier as set forth in claim 2 wherein said means for applying a potential between the base electrodes of said first and said second transistors comprises:

second and third current amplifiers, each having an input terminal and a common terminal and an output terminal, at least one of which second and third current amplifiers exhibiting a current gain that decreases with increasing current levels therein, the product of their low-level current gains exceeding unity;

means for applying a potential between the common terminals of said second and said third current amplifiers;

a direct current conductive path between the output terminal of said second current amplifier to the input terminal of said third current amplifier; and a direct current conductive path between the output terminal of said third current amplifier to the input terminal of said second current amplifier including:

a resistance connected between the base electrodes of said first and said second transistors.

10. A feedback amplifier as set forth in claim 2 wherein said means coupling the output terminal of said current amplifier to said first interconnection consists of a direct connection.

11. A feedback amplifier comprising:

first and second supply terminals for application of an operating potential therebetween;

a current amplifier having an input terminal and an output terminal between which a current gain of −G is exhibited and having a common terminal connected to said first supply terminal, G being a number substantially larger than a factor $\gamma$ which is in turn larger than unity;

a summing point to which the input terminal of said current amplifier is connected;

means for supplying an input current to said summing point;

first and second transistors of the same conductivity type, each having base and emitter and collector electrodes and being arranged for operation at substantially the same absolute temperature T as the other, the emitter electrodes of said first and said second transistors being directly connected to each other at an interconnection to which the output terminal of said current amplifier is galvanically coupled;

means coupling the collector electrode of said first transistor to said summing point;

means galvanically coupling the collector electrode of said second transistor to said second supply terminal;

bias means for offsetting the base potentials of said first and said second transistors from the potential appearing at said first supply terminal by respectively lesser and greater amounts which differ in fixed direct proportion to said temperature T, whereby said first and said second transistor split any current flow through the output terminal of said current amplifier by a factor $\gamma$ to flow in $1/(\gamma+1)$ :$\gamma/(\gamma+1)$ proportion through the collector electrodes of said first and said second transistors.

12. A feedback amplifier as set forth in claim 11 wherein said bias means comprises:

a first plurality, $n$ in number, of self-biased transistors in a first serial connection between said first supply terminal and the base electrode of said first transistor;

a second plurality, $n$ in number, of self-biased transistors in a second serial connection between said first supply terminal and the base electrode of said second transistor;

means for applying first and second bias currents which are in fixed proportion to each other respectively to said first serial connection and to said second serial connection in polings to condition the self-biased transistors in said first and said second serial connections for relatively easy conduction.

13. A feedback amplifier as set forth in claim 11 wherein said means coupling the collector electrode of said first transistor to said summing point comprises means for apportioning the current flow through the collector electrode of said first transistor in constant ratio between paths terminating at said summing point and at said second supply terminal respectively.

14. A feedback amplifier as set forth in claim 11 wherein said bias means comprises:

second and third current amplifiers, each having an input terminal and a common terminal and an output terminal, at least one of which second and third current amplifiers exhibiting a current gain that decreases with increasing current levels therein, the product of their low-level current gains exceeding unity;

means for applying a potential between the common terminals of said second and said third current amplifiers;

means for conducting a first bias current connected between the output terminal of said second current amplifier and the input terminal of said third current amplifier;

means for conducting a second bias current connected between the output terminal of said third current amplifier and the input terminal of said second current amplifier; and a resistance connected between the base electrodes of said first and said second transistors and arranged to conduct at least one of said first and said second bias currents.

15. A feedback amplifier comprising:

an input terminal for receiving an input current;

an output terminal;

a common terminal;

a current amplifier having input and output connections respectively to said input terminal and to said output terminal and having a common connection, the input connection of said current amplifier being receptive of a portion of said input current to cause output and common current flows through its output and common connections respectively that are respectively −G and (G+1) times as large as said portion of said input current, G being a number substantially larger than unity;

first and second transistors of the same conductivity type, being arranged for operation at substantially the same absolute temperature T, having respective emitter electrodes connected to the common terminal of said feedback amplifier, having respective collector electrodes and respective base electrodes, and having respective base-emitter junctions;

means coupling the collector electrode of said first transistor to said input terminal;

means coupling the collector electrode of second transistor to the common connection of said current amplifier for causing the collector current of said second transistor to flow as at least a portion of the common current flow of said current amplifier;

a direct-coupled collector-to-base feedback connection of said first transistor for adjusting its base potential to condition it to conduct its said at least a portion of the common current flow of said current amplifier; and means for applying an offset potential in fixed proportion to T between the base electrodes of said first and said second transistors in a poling such as to make the base potential of the second transistor as referred to the common terminal of said feedback amplifier smaller than the base potential of said first transistor similarly referred.

16. A feedback amplifier comprising
a reference terminal for application of a reference potential thereto;
a current amplifier having an input terminal and an output terminal and a common terminal, exhibiting a current gain of $-G$ between its said input and output terminals, and exhibiting a current gain of $(G+1)$ between its said input and said common terminals, G being a number substantially larger than unity;
first and second transistors of the same conductivity type, being arranged for operation at substantially the same absolute temperature T, having respective emitter electrodes connected to said reference terminal, having respective collector electrodes and respective base electrodes, and having respective base-emitter junctions;
means coupling the collector electrode of said first transistor to the input terminal of said current amplifier;
a connection of the base electrode of said first transistor to the collector electrode of said second transistor;
a third, self-biased transistor connected between the base and emitter electrodes of said second transistor and poled for simultaneous easy conduction with the base-emitter junction of said second transistor;
a number, n, at least one, of further self-biased transistors connected in a path between the collector electrode of said second transistor and the common terminal of said current amplifier, poled for easy conduction of the collector current of said second transistor, and
a number, n, at least one, of further self-biased transistors connected in a path between the base electrode of said second transistor and the common terminal of said current amplifier and poled for easy conduction of the base current of said second transistor.

17. A feedback amplifier comprising:
first, second and third terminals for receiving respectively a reference potential, a bias potential and an operating potential;
a current amplifier having an input terminal and an output terminal between which a current gain of $-G$ is exhibited and having a common terminal connected to said first terminal, G being substantially larger than unity;
first and second and third and fourth transistors of the same conductivity type, each having base and emitter electrodes with a base-emitter junction therebetween and each having a collector electrode;
a fifth, self-biased transistor connected between the base and emitter electrodes of said second transistor and poled for simultaneous easy conduction with the base-emitter junction of said second transistor;
an interconnection of the emitter electrodes of said first and said second transistors to which the output terminal of said current amplifier is galvanically coupled;
means connecting the base electrode of said first transistor to the collector electrode of said second transistor;
means galvanically coupling the collector electrode of said first transistor to the input terminal of said current amplifier;
means direct coupling said second terminal to the base electrodes of said third and said fourth transistors;
means galvanically coupling the collector electrode of said third transistor to said third terminal;
means galvanically coupling the collector electrode of said fourth transistor to said third terminal;
a fourth terminal from which output signal is available from said feedback amplifier and to which at least one of the collector electrodes of said third and said fourth transistors is connected;
a first direct current conductive path between the emitter electrode of said third transistor and the collector electrode of said second transistor; and
a second direct current conductive path between the emitter electrode of said fourth transistor and the base electrode of said second transistor.

18. A feedback amplifier as set forth in claim 17 wherein each of said first and said second direct current conductive paths is through a number n at least unity of further self-biased transistors poled for easy conduction.

19. A feedback amplifier comprising:
first, second and third terminals for receiving respectively a reference potential, a bias potential and an operating potential;
first and second current amplifiers, each having an input terminal and an output terminal and a common terminal, said first current amplifier exhibiting a current gain of $-G$ between its input and output terminals and a current gain of $(G+1)$ between its input and common terminal, G being a number substantially larger than unity, said second current amplifier exhibiting a current gain of $-W$ between its input and output terminals and a current gain of $(W+1)$ between its input and common terminals, W being a positive number, the common terminal of said first current amplifier being connected to the input terminal of said second current amplifier, the common terminal of said second current amplifier being connected to said first terminal;
means galvanically coupling the output terminal of said first current amplifier to said third terminal;
first and second and third and fourth transistors of the same conductivity type, each having base and emitter electrodes with a base-emitter junction therebetween and each having a collector electrode and being arranged for operation at substantially the same temperature T, the base electrode of said first transistor being connected to the collector electrode of said second transistor;
a fifth, self-biased transistor connected between the base and emitter electrodes of said second transistor and poled for simultaneous easy conduction with the base- emitter junction of said second transistor;
an interconnection between the emitter electrode of said first and said second transistors to which the output terminal of said second current amplifier is connected;

means galvanically coupling the collector electrode of said first transistor to the input terminal of said first current amplifier;

means direct coupling said second terminal to the base electrodes of said third and said fourth transistors;

means galvanically coupling the collector electrode of said third transistor to said third terminal;

means galvanically coupling the collector electrode of said fourth transistor to said third terminal;

a first direct current conductive path between the emitter electrode of said third transistor and the collector electrode of said second transistor; and a second direct current conductive path between the emitter electrode of said fourth transistor and the base electrode of said second transistor.

20. A feedback amplifier as set forth in claim 19 wherein each of said first and said second direct current conductive paths is through a number $n$ at least unity of further self-biased transistors poled for easy conduction.

21. A feedback amplifier as set forth in claim 19 wherein a common current path through load means is shared by (a) said means galvanically coupling the output current of said first current amplifier to said third terminal and at least one of (b) said means galvanically coupling the collector electrode of said third transistor to said third terminal and (c) said means galvanically coupling the collector electrode of said fourth transistor to said third terminal.

22. A feedback amplifier as set forth in claim 19 wherein said second current amplifier comprises a current mirror amplifier.

23. A feedback amplifier as set forth in claim 19 wherein said second current amplifier comprises:

seventh and eighth transistors of said similar conductivity type, each having base and emitter electrodes with a base-emitter junction therebetween and having a collector electrode, their emitter electrodes being connected to said first terminal, the base electrode of said seventh transistor being connected to the collector electrode of said eighth transistor, the collector electrode of said seventh transistor being connected to the interconnection between the emitter electrodes of said first and said second transistors;

a ninth, self-biased transistor connected between the base and emitter electrodes of said eighth transistor and poled for simultaneous easy conduction with the base-emitter junction of said eighth transistor;

a number, $n$ at least one of further self-biased transistors connected in a path between the common terminal of said first current amplifier and the collector electrode of said eighth transistor and poled for easy conduction of the collector current of said eighth transistor; and a number $n$ at least one of further self-biased transistors connected in a path between the common terminal of said first current amplifier and the base electrode of said eighth transistor and poled for easy conduction of the base current of said eighth transistor.

24. A feedback amplifier comprising:

first and second terminals for receiving respectively a reference potential and an operating potential;

first and second current amplifiers, each having an input terminal and an output terminal and a common terminal, said first current amplifier exhibiting a current gain of $-G$ between its said input and output terminals and exhibiting a current gain of $(G+1)$ between its said input and common terminals, G being a number substantially larger than unity, said second current amplifier exhibiting a well-defined current gain of $-W$ between its input and output terminals and a well-defined current gain of $(W+1)$ between its input and common terminals, W being a positive number, the common terminal of said first current amplifier being connected to the input terminal of said second current amplifier, the common terminal of said second current amplifier being connected to said first terminal;

means galvanically coupling the output terminal of said first current amplifier to said second terminal;

first and second transistors of similar conductivity type, each having base and emitter and collector electrodes and being arranged for operation at substantially the same temperature T;

an interconnection between the emitter electrodes of said first and second transistors to which the output terminal of said second current amplifier is connected;

means galvanically coupling the collector electrode of said first transistor to the input terminal of said first current amplifier;

means galvanically coupling the collector electrode of said second transistor to said second terminal; and bias means for offsetting the potentials of said first and said second transistors from said reference potential by respectively lesser and greater amounts which differ in direct proportion to T.

25. A feedback amplifier as set forth in claim 24 wherein a common current path is shared by (a) said means galvanically coupling the output terminal of said first current amplifier to said second terminal and (b) said means galvanically coupling the collector electrode of said second transistor to said second terminal.

26. A feedback amplifier as set forth in claim 25 wherein said common current path is through load means.

27. A feedback amplifier as set forth in claim 24 wherein said bias means comprises:

third and fourth current amplifiers, each having an input terminal and a common terminal and an output terminal, at least one of which third and fourth current amplifiers exhibiting a current gain that decreases with increasing current levels therein, the product of their low-level current gains exceeding unity, the common terminals of said third and said fourth current amplifiers being respectively coupled to said first terminal and to said second terminal;

means for conducting a first bias current connected between the output terminal of said second current amplifier and the input terminal of said third current amplifier;

means for conducting a second bias current connected between the output terminal of said third current amplifier and the input terminal of said second current amplifier; and a resistance connected between the base electrodes of said first and said second transistors and arranged to conduct at least one of said first and said second bias currents.

* * * * *